United States Patent
Lee

(10) Patent No.: US 7,541,639 B2
(45) Date of Patent: Jun. 2, 2009

(54) MEMORY DEVICE AND METHOD OF FABRICATING THE SAME

(75) Inventor: Tzyh-Cheang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 11/724,283

(22) Filed: Mar. 15, 2007

(65) Prior Publication Data

US 2008/0230829 A1  Sep. 25, 2008

(51) Int. Cl.
*H01L 29/423* (2006.01)
(52) U.S. Cl. .................. 257/316; 257/315; 257/324; 257/E29.129
(58) Field of Classification Search ............. 257/315, 257/316, 324, E29.129
See application file for complete search history.

(56) References Cited

U.S. PATENT DOCUMENTS

| 6,011,725 | A | 1/2000 | Eitan | |
| 6,911,691 | B2 * | 6/2005 | Tomiie et al. | 257/324 |
| 6,963,508 | B1 | 11/2005 | Shone | |
| 2005/0161701 | A1 * | 7/2005 | Tomiie et al. | 257/139 |
| 2007/0066014 | A1 * | 3/2007 | Park et al. | 438/257 |
| 2007/0166908 | A1 * | 7/2007 | Min et al. | 438/216 |

* cited by examiner

*Primary Examiner*—Victor A Mandala
(74) *Attorney, Agent, or Firm*—Birch, Stewart, Kolasch & Birch, LLP

(57) ABSTRACT

A memory device and a method of fabricating the same. The memory device includes a substrate and a first gate electrode overlying the substrate. Overlying a top surface of the first gate electrode, a second gate electrode comprises end portions extending to spaces adjacent to the substrate and sidewalls of the first gate electrode. Further, a dielectric layer comprises a first portion sandwiched between the first gate electrode and the second gate electrode, and second portions extending from the first portion, sandwiched between the substrate and the end portions of the second gate electrode.

15 Claims, 9 Drawing Sheets

MEMORY DEVICE AND METHOD OF FABRICATING THE SAME

BACKGROUND OF THE INVENTION

1. Field of the Invention

The invention relates to semiconductor technology and in particular to memory devices.

2. Description of the Related Art

Non-volatile memory devices are currently in wide use in electronic components that require the retention of information when electrical power is terminated. Non-volatile memory devices include read only memory (ROM), programmable read only memory (PROM), erasable programmable read only memory (EPROM) and electrically erasable programmable read only memory (EEPROM) devices. EEPROM devices differ from other non-volatile memory devices in that they can be electrically programmed and erased. Flash EEPROM devices are similar to EEPROM devices in that memory cells can be programmed and erased electrically. Flash EEPROM devices, however, enable erasure of all memory cells in the device using a single electrical current pulse.

Typically, an EEPROM device includes a floating-gate electrode upon which electrical charge is stored. In a flash EEPROM device, electrons are transferred to a floating-gate electrode through a dielectric layer overlying the channel region of the transistor. The electron transfer is initiated by either hot electron injection or Fowler-Nordheim (F-N) tunneling. One important dielectric material for the fabrication of the floating-gate electrode is an oxide-nitride-oxide (ONO) structure. During programming, electrical charges are transferred from the substrate to the silicon nitride layer in the ONO structure and trapped therein. Moreover, non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice the information of a conventional EEPROM in a memory array of equal size. A left bit and right bit are stored in physically different areas of the silicon nitride layer, near left and right regions of each memory cell.

Referring to FIG. 1, a related art introduces an operating method for an EEPROM device 10, namely a SONOS (silicon-oxide-nitride-oxide-silicon) device, having a non-conducting charge trapping dielectric, such as a silicon nitride layer 20, sandwiched between two silicon oxide layers 18 and 22 acting as electrical insulators. In view of localized trapping electron charge capability of the silicon nitride layer 20, the EEPROM device 10 is capable of storing two bits of information, i.e., there are two bits per cell. A left bit and a right bit are stored in physically different areas of the silicon nitride layer 20, near left and right regions of the memory cell 10, respectively.

To program the right bit, for example, programming voltages are applied to the gate electrode 24 and drain 16 and hot electrons are injected into and trapped in the charge trapping layer 20 in the region near the drain defined by the dashed circle 23. Correspondingly, the threshold voltage of the portion of the channel under the trapped charge increases as more and more electrons are injected into the nitride layer. Similarly, the left bit is programmed by applying programming voltages to the gate electrode 24 and source 14. Hot electrons are injected into and trapped in the charge trapping layer 20 in the region defined by the dashed circle 21. The threshold voltage of the portion of the channel under the trapped charge comprising the left bit increases as more and more electrons are injected into the nitride layer.

Using the right bit as an example, one erasure technique simultaneously applies a negative potential to the gate electrode 24 and a positive potential to the drain 16 such that holes from the drain 16 flow into the charge trapping nitride layer 20 via the bottom oxide 18, combining with the electrons trapped in the charge trapping nitride layer 20. The left bit is erased in a similar fashion except that a positive potential is applied to the source 14 rather than the drain 16. Using the right bit as an example, a second well known technique simultaneously applies a positive voltage potential to the gate electrode 24 and zero potential, i.e., ground, to the drain 16 such that holes from the gate electrode 24 flow through the top oxide 22 into the charge trapping nitride layer 20, combining with the electrons trapped in the charge trapping nitride layer 20. The left bit is erased in a similar fashion with zero potential applied to the source 14.

As the integrity of integrated circuits increases, the size of semiconductor devices, such as the width of the gate electrode 24 shown in FIG. 1, is reduced, bring the right bit and the left bit closer to each other. Finally, the right bit and the left bit potentially "unify" as a single bit, such that the memory device is no longer a two-bit EEPROM.

Referring to FIG. 2, S and D respectively indicate positions of the source 14 and drain 16 shown in FIG. 1, the solid curves 21e and 23e respectively show the electron distribution in the dashed circles 21 and 23 during programming of the left bit and the right bit of the device shown in FIG. 1, and the dashed curves 21h and 23h respectively show the hole distribution in the dashed circles 21 and 23 during erasure of the left bit and the right bit of the device shown in FIG. 1. The deviation between the electron and hole distributions causes incomplete combination of electrons and holes during erasure of the left bit and the right bit of the device shown in FIG. 1, resulting in charge accumulation upon completion of a program-erase cycle, negatively affecting the reliability of the memory device.

BRIEF SUMMARY OF THE INVENTION

The invention provides memory devices and methods of fabricating the same, providing shorter channel length, separation of two bits, better programming efficiency, and higher device reliability.

Semiconductor devices are provided. An embodiment of such a semiconductor device comprises a substrate and a first gate electrode overlying the substrate. Overlying a top surface of the first gate electrode, a second gate electrode comprises end portions extending to spaces adjacent to the substrate and sidewalls of the first gate electrode. Further, a dielectric layer comprises a first portion sandwiched between the first gate electrode and the second gate electrode, and second portions extending from the first portion, sandwiched between the substrate and the end portions of the second gate electrode.

Flash EEPROMs are further provided. An embodiment of such a flash EEPROM comprises a substrate and a first gate electrode overlying the substrate. Overlying a top surface of the first gate electrode, a second gate electrode comprises a pair of end portions extending to spaces adjacent to the substrate and sidewalls of the first gate electrode. Further, a dielectric layer comprises a first portion sandwiched between the first gate electrode and the second gate electrode, and a pair of second portions extending from the first portion, sandwiched between the substrate and the pair of end portions of the second gate electrode.

In addition, two-bit flash EEPROMs are provided. An embodiment of such a two-bit flash EEPROM comprises a substrate and an assistant gate electrode overlying the substrate. Overlying a top surface of the assistant gate electrode, a control gate electrode comprises a pair of end portions extending to spaces adjacent to the substrate and sidewalls of the assistant gate electrode. Further, a dielectric layer comprises a first portion, sandwiched between the assistant gate electrode and the control gate electrode, and a pair of second portions extending from the first portion, sandwiched between the substrate and the pair of end portions of the control gate electrode, thereby serving as two bits.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
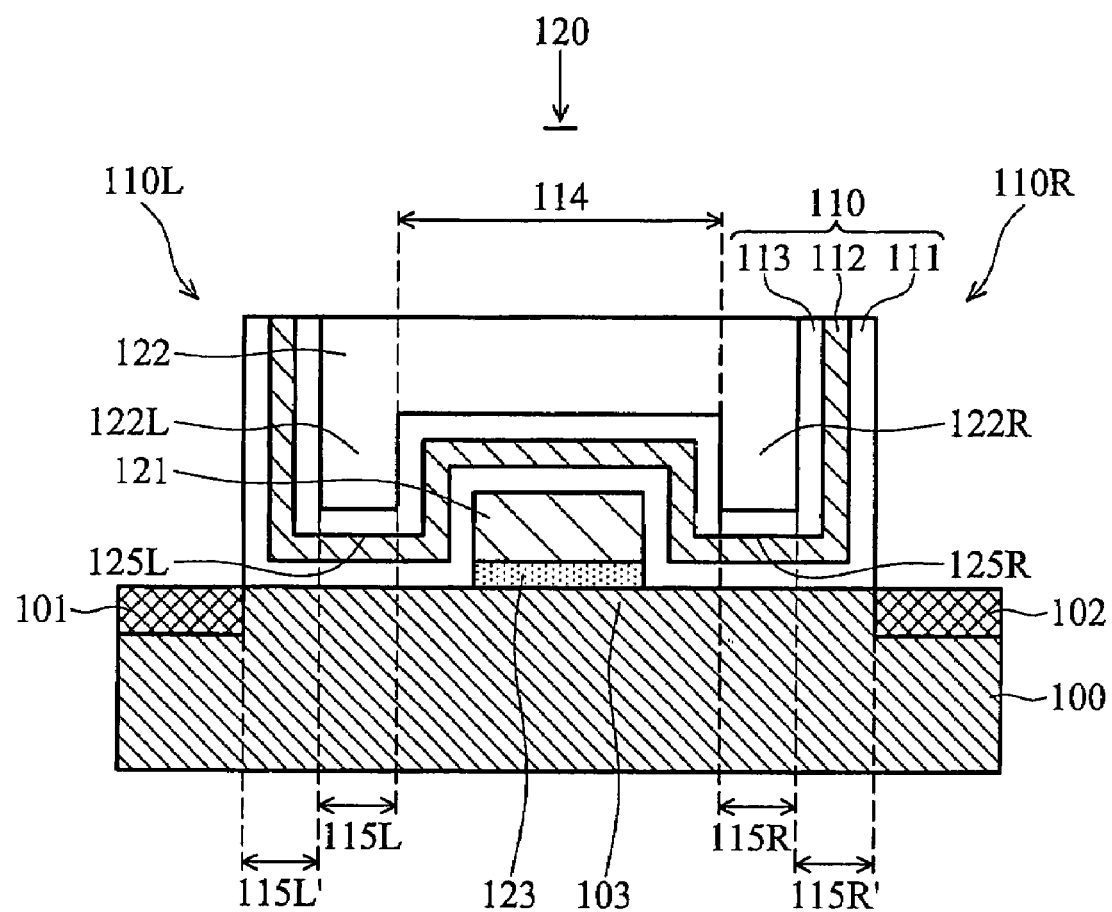
FIG. 3 is a cross-section of a memory device of a preferred embodiment of the invention.

Referring to FIG. 3, a memory cell of a preferred embodiment of the invention is shown. The memory cell comprises a substrate 100, a gate structure 120, and a composite dielectric layer 110.

The substrate 100 comprises semiconductor materials such as silicon, germanium, silicon germanium, compound semiconductor, or other known semiconductor materials. The substrate 100 comprises a source region 101, a drain region 102, and a channel region 103 therebetween.

The gate structure 120, comprising an upper gate electrode 122 and a lower gate electrode 121, overlies the substrate 100. In this embodiment, the gate structure 120 overlies the channel region 103. Generally, the upper gate electrode 122 and the lower gate electrode 121 may be made of conductive material, such as doped polycrystalline silicon, metals, metal silicides, a combination thereof, or other conductive materials. The composite dielectric layer 110 overlies the substrate 100. In details, overlying a top surface of the lower gate electrode 121, the upper gate electrode 122 further comprises end portions 122L and 122R extending to spaces 125L and 125R adjacent to the substrate 100 and sidewalls of the lower gate electrode 121. In one example, the spaces 125L and 125R are lower than the top surface of the lower gate electrode 121 and near the substrate 100.

The composite dielectric layer 110 comprises a first portion 114 and a pair of second portions 115R and 115L. The first portion 114 is on a different horizontal plane than the second portions 115R and 115L. The second portions 115R and 115L connect the first portion 114 on either side thereof. In this embodiment, the first portion 114 is sandwiched between the lower gate electrode 121 and the upper gate electrode 122, and the pair of second portions 115R and 115L extending from the first portion 114 are sandwiched between the substrate 100 and the pair of end portions 122L and 122R of the upper gate electrode 122. In addition, a pair of third portions 115R' and 115L' may further extend from the pair of the second portions 115R and 115L and surround sidewalls of the end portions 122R and 122L of the upper gate electrode 122. Thus, in one example, the lower gate electrode 121 may serve as an assistant gate electrode, which overlies a part of the channel region 103, and is narrower than the upper gate electrode 122 serving as a control gate for a flash EEPROM.

In this embodiment, the second portions 115R and 115L are on approximately the same plane, and the end portions 122R and 122L of the upper gate electrode 122 extend into the spaces 125L and 125R, covering the lower gate electrode 121 on either side thereof. In some embodiments, the composite dielectric layer 110 completely covers the lower gate electrode 121 and the channel region 103. In an alternative embodiment, the channel region 103 may be partially raised or recessed, and the second portions 115R and 115L thereabove are at different horizontal planes. In an alternative embodiment, the channel region 103 may be partially raised, and thus, either one of the second portions 115R and 115L thereabove is on approximately the same horizontal plane as the first portion 114, and the other is on a different horizontal plane. In one example, a raised portion of the channel region 103 may substitute for the lower gate electrode 121

In an alternative embodiment, the layer 121, serving as the assistant gate electrode, is preferably conductive, comprising doped polycrystalline silicon, metals, metal silicides, a combination thereof, or other conductive materials, for example, as subsequently described, and thus, it is necessary to dispose a dielectric layer 123 between the channel region 103 and the layer 121. Thus, the dielectric layer 123, preferably narrower than the channel region, is disposed overlying the channel region, acting as a gate dielectric layer. Further, the layer 121 overlies the dielectric layer 123, and the composite dielectric layer 110 overlies the layer 121 and the substrate 100, specifically the channel region 103. Thus, the first portion 114 is aligned with the layer 121. Moreover, the second gate electrode 122, wider than the layer 121, overlies the composite dielectric layer 110.

The composite dielectric layer 110 may further extend to either side of the gate electrode 122, and may be capable of trapping carriers such as electrons or holes therein, and thus the inventive device acts as a memory device. In this embodiment, the composite dielectric layer 110 comprises a tunneling layer 111, a charge trapping layer 112 overlying the tunneling layer 111, and a blocking layer 113 overlying the charge trapping layer 112, and thus, the charge trapping layer 112 is sandwiched between the tunneling layer 111 and the blocking layer 113 of different materials or compositions from the tunneling layer 111. In some cases, the composite dielectric layer 110 may comprise more layers comprising the layers 111 through 113. In some embodiments, the layer 112 is a nitride layer, and the layers 111, 113 are oxide layers. In an alternative embodiment, the layers 111 through 113 comprise nitride of different compositions. The electrons, for example, are trapped in the charge trapping layer 112 in the second portions 115R and 115L during programming of the inventive memory device, respectively acting as a right bit and a left bit thereof. It is appreciated that either or both of the second portions 115R and 115L are on a different horizontal plane than the first portion 114, thereby efficiently isolating the two bits, such that the bit unification occurring in conventional memory cells never occurs even when the width of the gate structure 120 or the length of the channel region 103 is reduced to nano-scale. For example, in a semiconductor process, a half pitch (F) is half the distance between memory cells in a memory chip, and then the width of the first gate electrode 121 can be between about ⅓ (F) and ⅔ (F).

When the layer 121 is conductive as described, the layer 121 acts as an assistant gate of the gate structure 120 and the layer 122 acts as a control gate thereof during programming and erasure of the inventive memory device.

To program the right bit, for example, programming voltages are applied to the assistant gate 121, the control gate 122, and the drain region 102, and thus, hot electrons are injected into and trapped in the charge trapping layer 112 in the right second portion 115R. Correspondingly, the threshold voltage of the portion of the channel region 103 under the trapped charge increases as more electrons are injected into the charge trapping layer 112. Programming voltage applied to the control gate 122 is higher than that to the assistant gate 121, and thus, the charge injection on the right second portion 115R is more efficient. For example, programming voltage applied to the assistant gate 121 is preferably between about 1 and about 2V and programming voltage applied to the control gate 122 is preferably between about 8 and about 10V. Further, programming voltage applied to the drain region 102 is preferably between about 3 and about 5V.

Similarly, the left bit is programmed by applying programming voltages to the assistant gate 121, the control gate 122, and the source region 101. Hot electrons are injected into and trapped in the charge trapping layer 112 in the left second portion 115L. The threshold voltage of the portion of the channel region 103 under the trapped charge comprising the left bit increases as more electrons are injected into the charge trapping layer 112. Programming voltage applied to the control gate 122 is higher than that to the assistant gate 121, and thus, the charge injection on the left second portion 115L is more efficient. For example, programming voltage applied to the assistant gate 121 is preferably between about 1 and about 2V and programming voltage applied to the control gate 122 is preferably between about 8 and about 10V. Further, programming voltage applied to the source region 101 is preferably between about 3 and about 5V.

Figure 1:
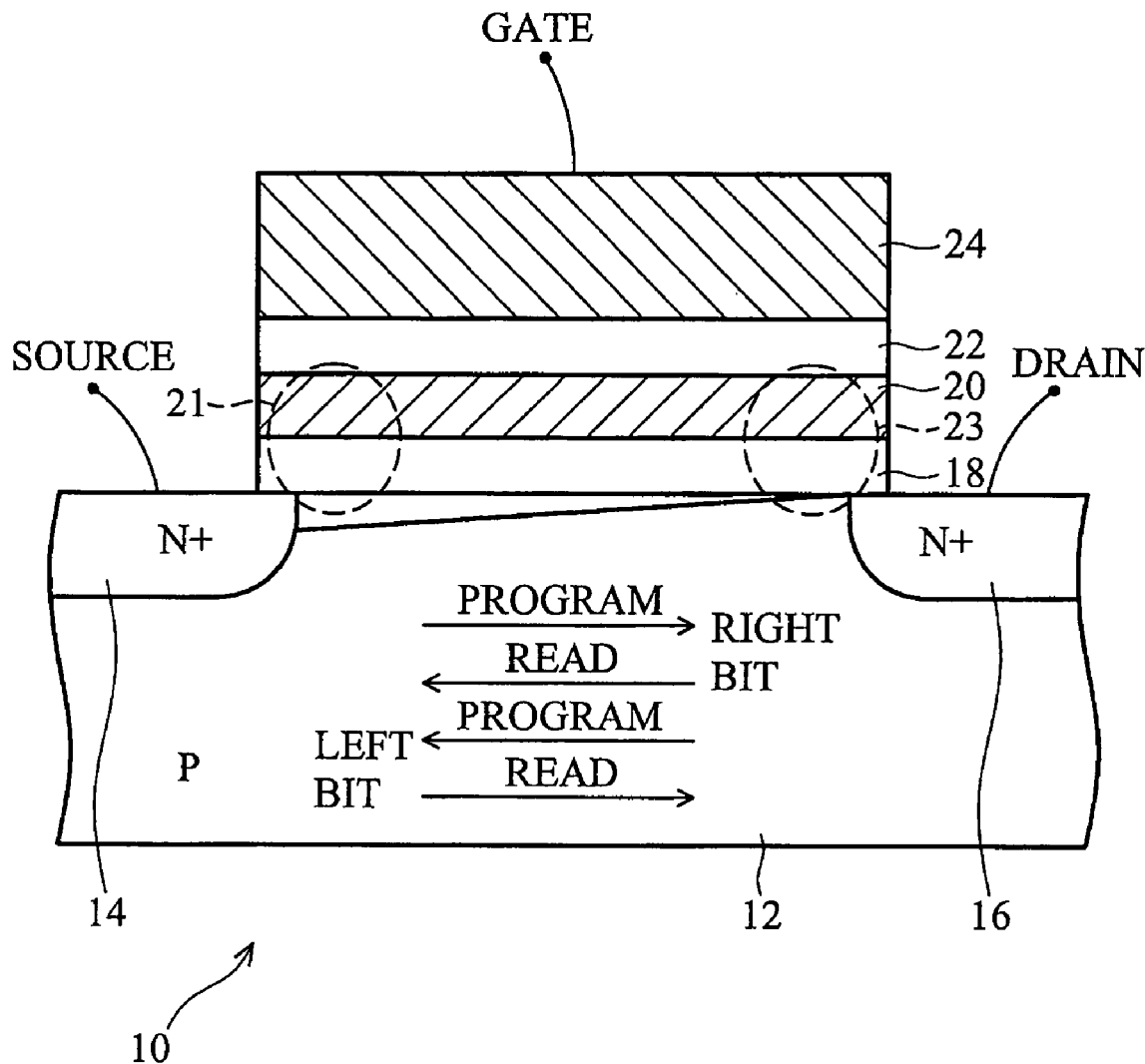
FIG. 1 is a cross-section of a conventional memory device.
Figure 2:
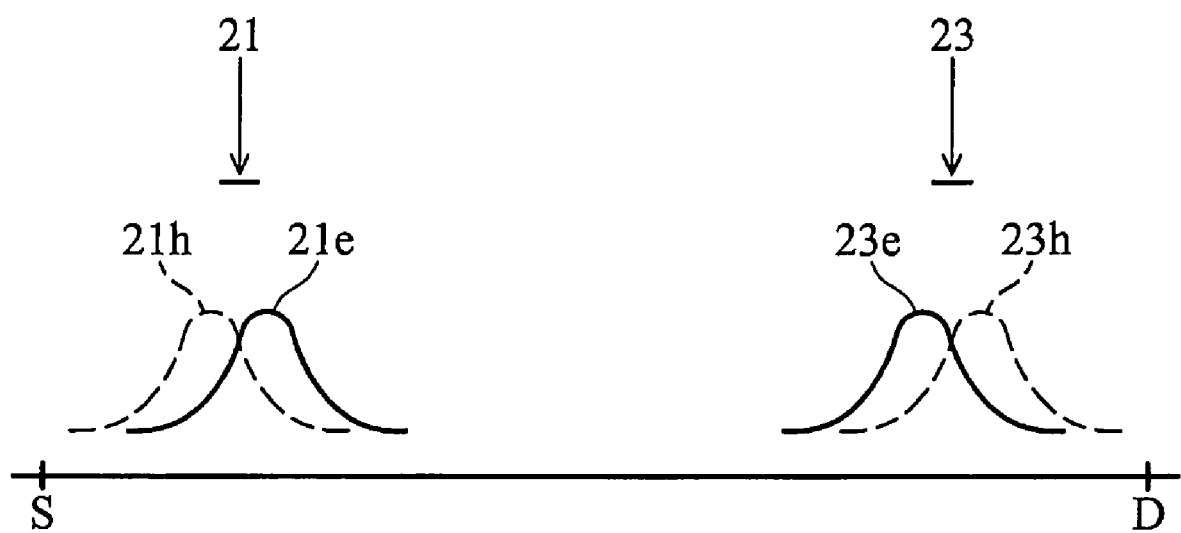
FIG. 2 is a graphic chart of carrier distribution during operation of the memory device shown in FIG. 1.

Using the right bit as an example, one erasure technique simultaneously applies a negative potential to the assistant gate 121 and control gate 122, and a positive potential to the drain region 102 such that holes from the drain region 102 flow into the charge trapping nitride layer 112 via the tunneling layer 111, combining with the electrons trapped in the charge trapping nitride layer 112. Potential difference applied to the control gate 122 is higher than that to the assistant gate 121. For example, erasing voltage applied to the assistant gate 121 is preferably between about −1 and about −2V and erasing voltage applied to the control gate 122 is preferably between about −5 and about −8V. Further, erasing voltage applied to the drain region 102 is preferably between about 3 and about 5V. It is appreciate that the erasing voltage applied to the assistant gate 121 shifts the hole distribution in the right second portion 115R to the left to match the electron distribution resulting from programming as compared with the electron and hole distributions 23$e$ and 23$h$ of the conventional memory device shown in FIG. 2, and thus, the electrons trapped in the charge trapping layer 112 substantially completely combine with the injected hole during erasure of the inventive memory device, preventing or decreasing charge accumulation in the charge trapping layer 112 and thus improving the device reliability.

The left bit is erased in a similar fashion except that a positive potential is applied to the source region 101 rather than the drain region 102. Potential difference applied to the control gate 122 is higher than that to the assistant gate 121. For example, erasing voltage applied to the assistant gate 121 is preferably between about −1 and about −2V while erasing voltage applied to the control gate 122 is preferably between about −5 and about −8V. Further, erasing voltage applied to the source region 101 is preferably between about 3 and about 5V. It is appreciated that the erasing voltage applied to the assistant gate 121 shifts the hole distribution in the left second portion 115L to the right to match the electron distribution resulting from programming as compared with the electron and hole distributions 21$e$ and 21$h$ of the conventional memory device shown in FIG. 2, and thus, the electrons trapped in the charge trapping layer 112 can substantially completely combine with the injected hole during erasure of the inventive memory device, preventing or decreasing the charge accumulation in the charge trapping layer 112 and thus improving the device reliability.

In FIGS. 4A through 4D, cross-sections of a method of fabricating the memory device of the invention are shown.

Figure 4A:
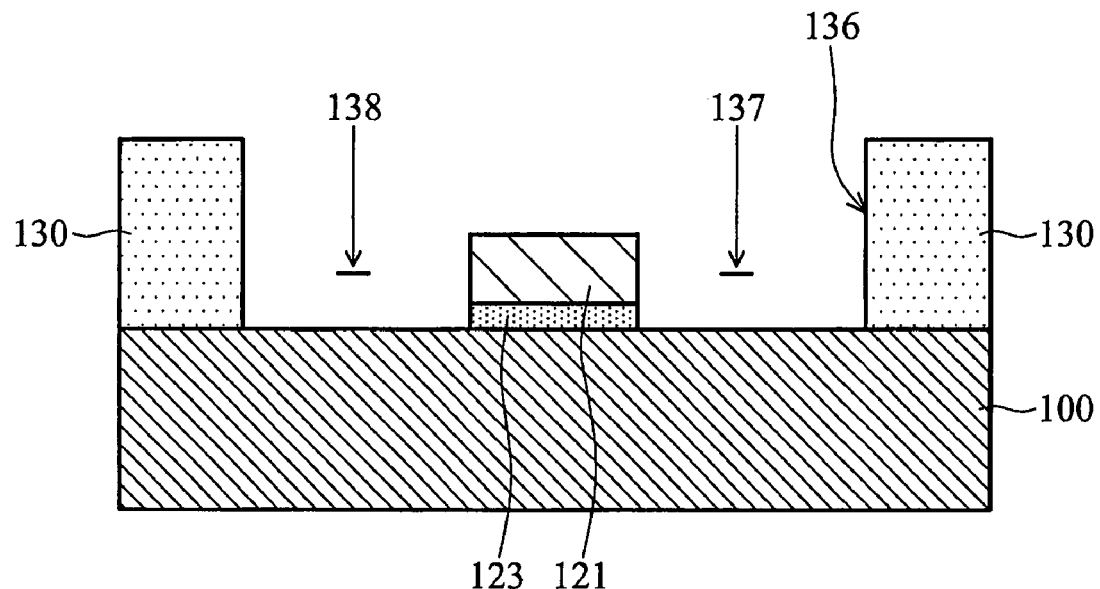
FIGS. 4A through 4D are cross-sections of a method of fabricating the memory device of the invention.

In FIG. 4A, a substrate 100 is provided. A pattern of the layer 121 is then formed overlying the substrate 100. In some cases, the dielectric layer 123 is formed overlying the substrate 100 prior to the formation of the layer 121 when the layer 121 is conductive. In some cases, the conductive layer 121 acts as a gate electrode of the inventive memory device, and the layer 123 acts as a gate dielectric layer. Thus, the pattern comprising the gate electrode 121 and the gate dielectric layer 123 is formed by a conventional gate formation process. For example, the dielectric layer 123 is formed overlying the complete substrate 100 by oxidation of the substrate 100, chemical vapor deposition (CVD), or other method, followed by formation of the conductive layer 121 overlying the complete substrate 100 utilizing physical vapor deposition (PVD), CVD, electroplating, electroless plating, or other method, and patterning of the conductive layer 121 and the gate dielectric layer 123. Alternatively, the pattern comprising the gate electrode 121 and the gate dielectric layer 123 is preferably formed by a method as subsequently described for FIGS. 5A through 5H. In other cases, the pattern of the layer 121 may be formed by patterning of the substrate 100 or epitaxy growth of a semiconductor material overlying the substrate 100.

In FIG. 4A, a mask layer 130 is formed overlying the substrate 100. The mask layer 130 is patterned and comprises a gate opening 136 exposing the top and at least one sidewall of the layer 121, and parts of the substrate 100. In this embodiment, the gate opening 136 comprises spaces 125R and 125L exposing either side of the layers 121 and 123, and the corresponding substrate 100 on either side thereof. In some cases, the mask layer 130 is preferably formed prior to the formation of the layers 121 and 123 as subsequently described for FIGS. 5A through 5H. In other cases, the mask layer may be formed and then patterned following the formation of the layers 121 and 123.

Figure 4B:
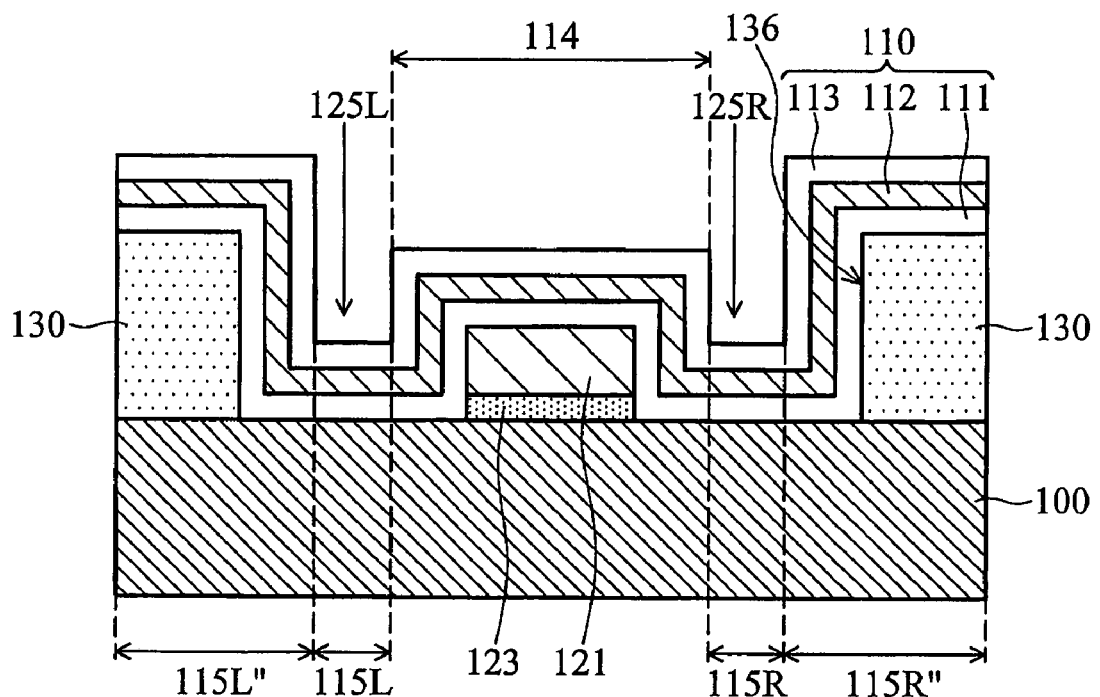

In FIG. 4B, the composite dielectric layer 110, comprising a first portion 114, a pair of second portions 115R and 115L and a pair of third portions 115R" and 115L" extending therefrom, is conformally formed overlying the sidewalls of the gate opening 136, the exposed substrate 100, and the exposed layers 121 and 123. Specifically, the layers 111 through 113 are sequentially formed by a method such as CVD or other method.

Figure 4C:
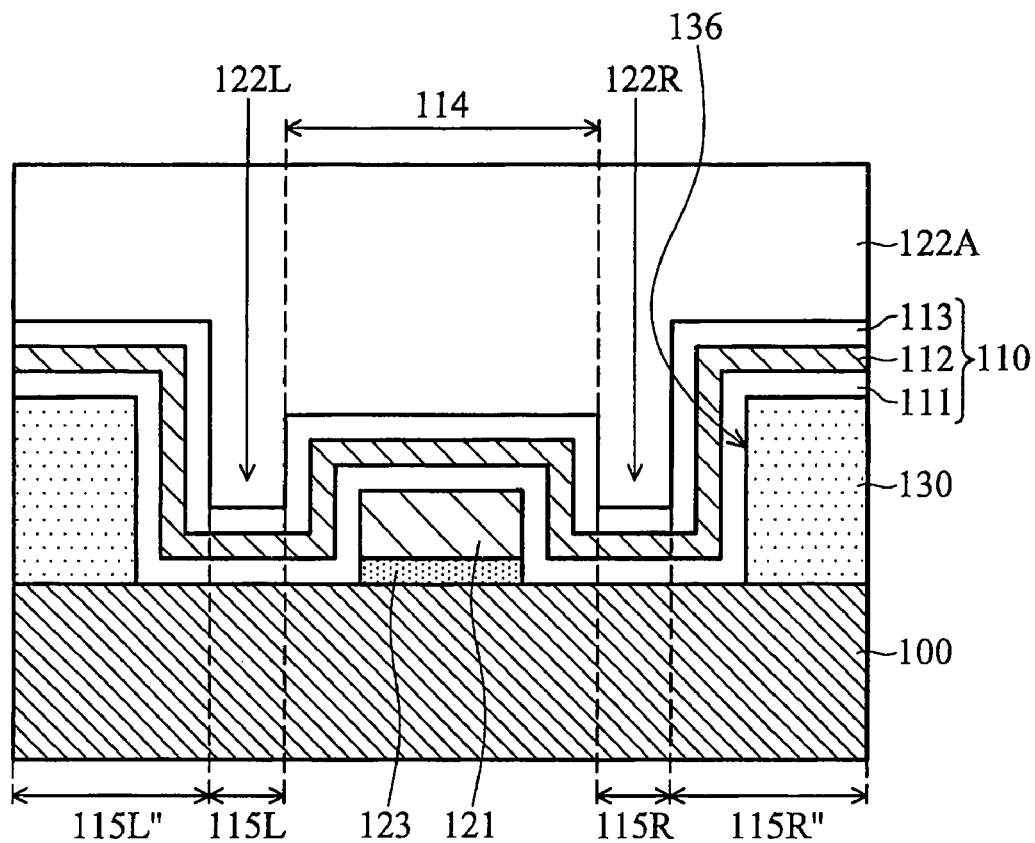
Figure 4D:
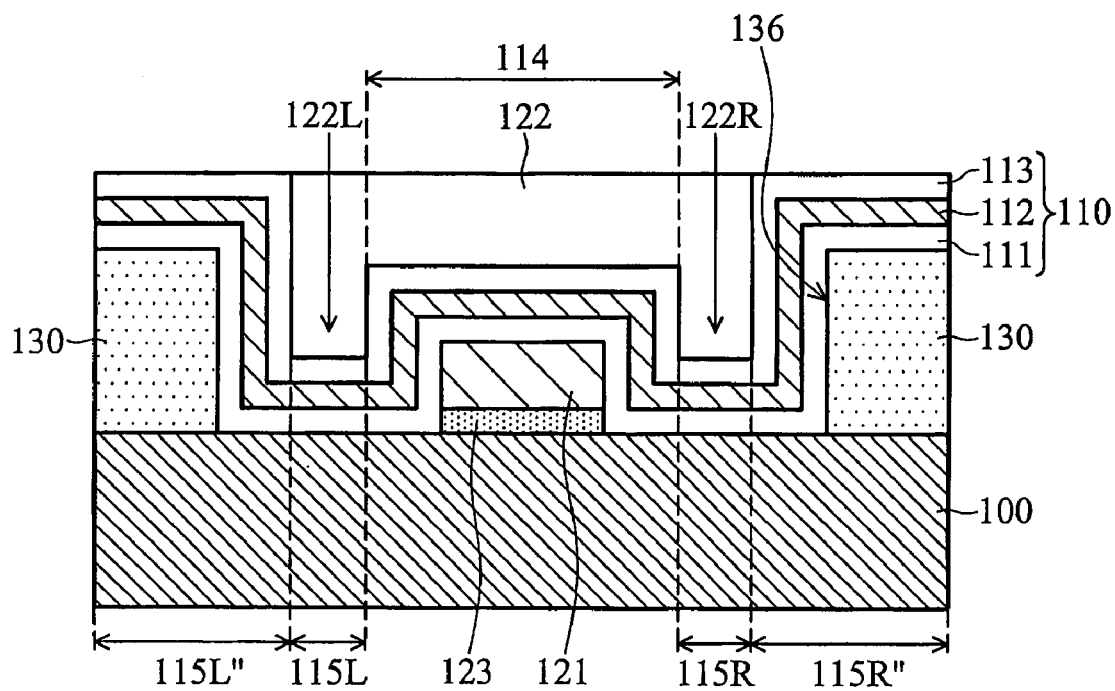

Next, the gate opening 136 is filled with a conductive material, acting as an upper gate electrode 122 as shown in FIG. 4D. Note that the steps shown in FIGS. 4C and 4D are exemplary, and not intended to limit the scope of the invention. Those skilled in the art will recognize the possibility of using various methods to achieve the formation of the upper gate electrode 122 shown in FIG. 4D.

In FIG. 4C, a blanket layer 122A is formed overlying the substrate 100 and completely covering the gate opening 136. The blanket layer 122A comprises a conductive material such as doped polycrystalline silicon, metals, metal silicide, a combination thereof, or other conductive material.

In FIG. 4D, the blanket layer 122A beyond the gate opening 136 is removed by isotropic etching, chemical mechanical polishing (CMP), a combination thereof, or other method. Further, the composite dielectric layer 111 beyond the gate opening 136 may be also removed. The remaining blanket layer 122A in the gate opening 136 acts as the gate electrode 122.

Finally, the mask layer 130 is removed by a method such as selective etching, chemical stripping, or other method. The layers 121 through 123 and 110 act as the gate structure 120 as shown in FIG. 3. Further, the substrate 100 on either side of the gate structure 120 shown in FIG. 3 is doped by any known ion implantation process to form the source and drain regions 101 and 102. Thus, the inventive memory device shown in FIG. 3 is complete.

In some cases, the pattern comprising the assistant gate electrode 121 and the control gate electrode 123 is preferably formed by a method shown in FIGS. 5A through 5H. Only one lithography mask is utilized in this method, and thus, the channel length of the channel region 103 shown in FIG. 3 can be controlled and minimized, and the production cost of the inventive memory device can be reduced. For example, the channel length of the channel region 103 can be reduced to nano-scale by utilization of this method.

Figure 5A:
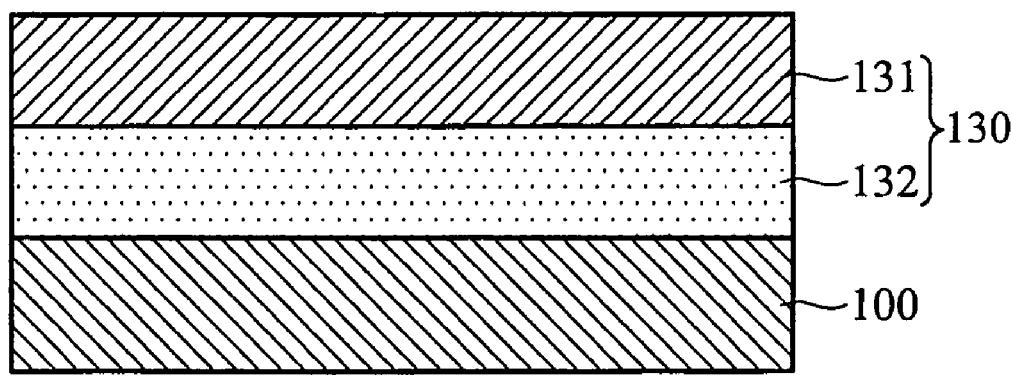
FIGS. 5A through 5H are cross-sections showing preferred steps of a method of fabricating the memory device of the invention.

In FIG. 5A, the substrate 100 is provided, followed by sequential formation of a dielectric layer 132 overlying the substrate 100 and a dielectric layer 131 overlying the dielectric layer 132. The dielectric layers 131 and 132 are utilized as the mask layer 130. The dielectric layers 131 and 132 can be formed by a method such as CVD, spin coating, or other method. The properties of the dielectric layers 131 and 132 are properly selected under the only conditions that the dielectric layer 132 can be an etch stop layer during the subsequent etching of the dielectric layer 131, and the dielectric layer 131 can be an etch mask during the subsequent etching of the dielectric layer 132. In some cases, the mask layer 130 may comprise more layers.

Figure 5B:
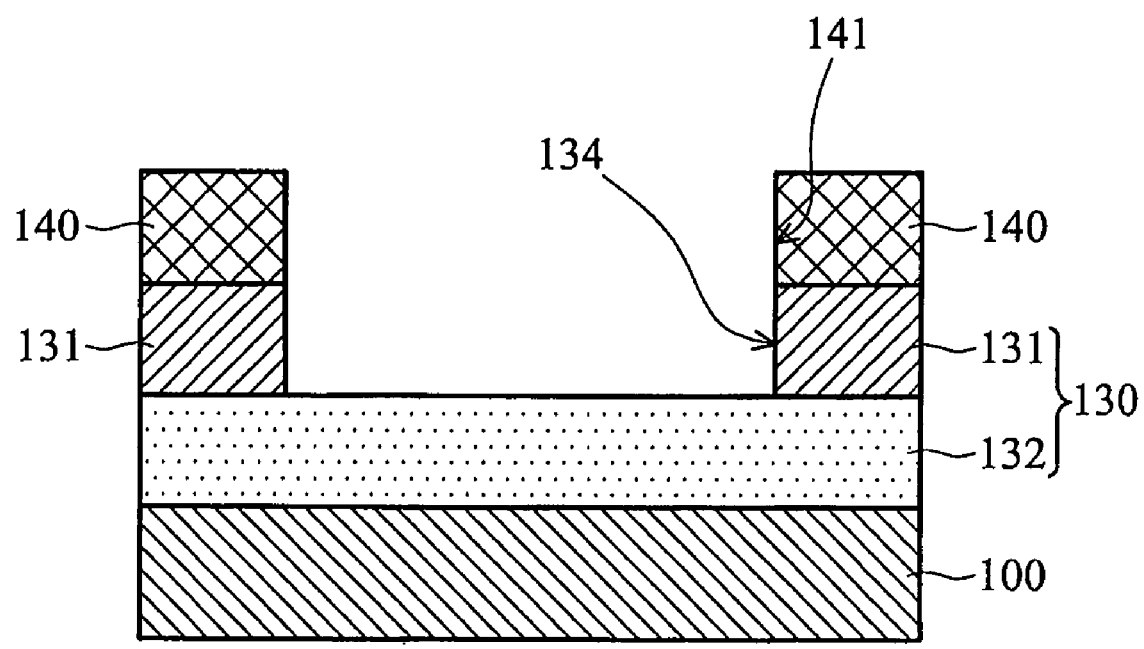

In FIG. 5B, the dielectric layer 131 is patterned, forming a preliminary opening 134 therein, exposing parts of the dielectric layer 132. The width of the preliminary opening 134 corresponds to the width of the gate structure 120 shown in FIG. 3. For example, a resist layer 140 is formed overlying the dielectric layer 131, followed by application of a lithography mask (not shown) comprising a pattern of the preliminary opening 134 over the resist layer 140. The resist layer 140 is then exposed via the lithography mask, followed by removal of the lithography mask, and development and baking for the resist layer 140 to form an opening 141 therein. The dielectric layer 131 is etched utilizing the resist layer 140 as an etch mask and the dielectric layer 132 as an etch stop layer, and thus, the etching substantially stops on the dielectric layer 132 and the preliminary opening 134 is formed, completing the patterning of the dielectric layer 131.

Figure 5C:
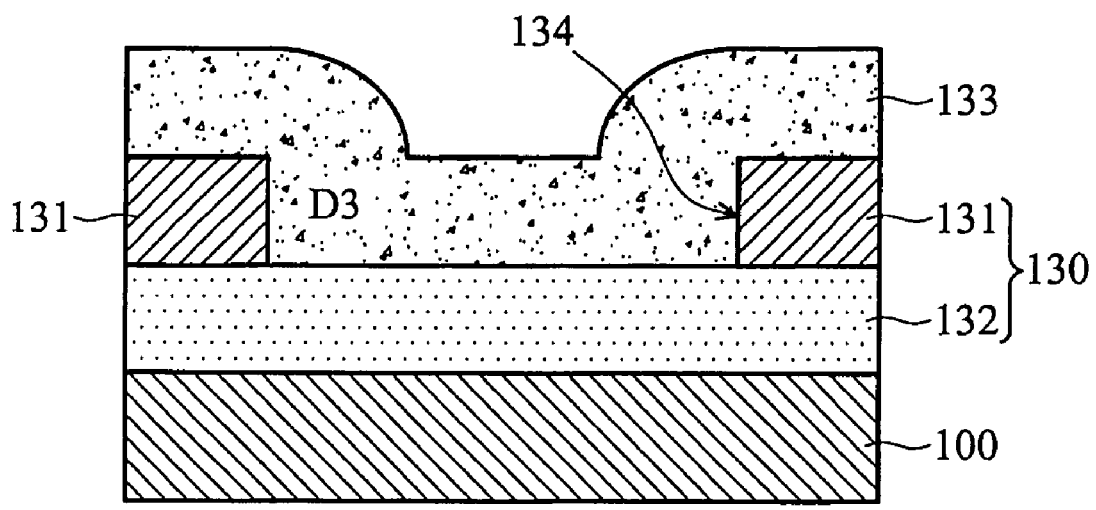
Figure 5D:
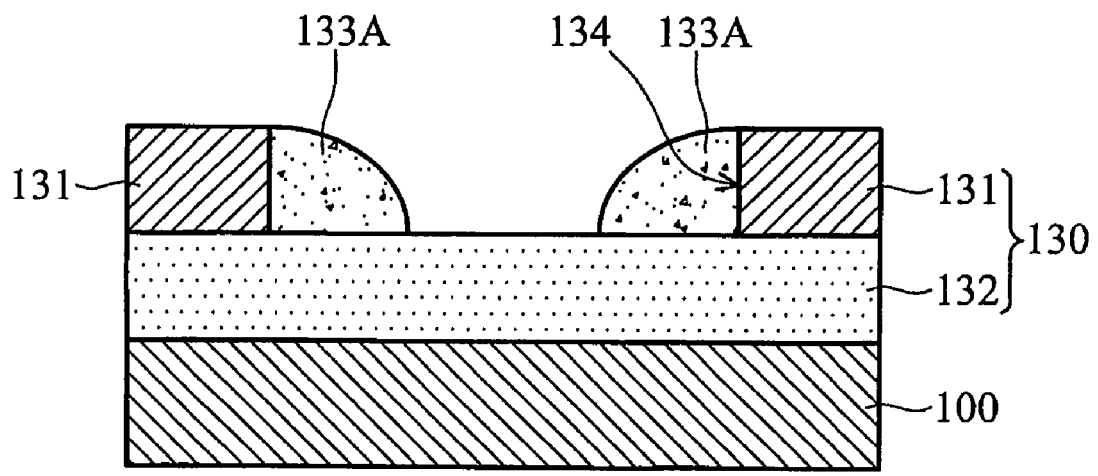

Next, at least one dielectric spacer 133A is formed on at least one sidewall of the first preliminary opening 134 and overlying parts of the exposed dielectric layer 132 as shown in FIG. 5D. In this embodiment, a plurality of the dielectric spacers 133A are formed on either sidewall of the first preliminary opening 134 and overlying parts of the exposed dielectric layer 132. Note that the steps shown in FIGS. 5C and 5D are exemplary, and not intended to limit the scope of the invention. Those skilled in the art will recognize the possibility of using various methods to achieve the formation of the dielectric spacers 133A shown in FIG. 5D.

In FIG. 5C, a dielectric layer 133 is formed overlying the dielectric layer 131 and the exposed dielectric layer 132 by a method such as CVD. The properties of the dielectric layer 133 are properly selected under the only conditions that the dielectric layers 131 and 132 can both be etch stop layers during the subsequent etching thereof, the dielectric layer 133 can be an etch mask during the subsequent etching of the dielectric layer 132, and the dielectric layer 131 can be an etch mask during the subsequent etching of the dielectric layer 133.

In FIG. 5D, the dielectric layer 133 is isotropically etched utilizing the dielectric layers 131 and 132 as etch masks, leaving the dielectric spacers 133A on either sidewall of the preliminary opening 134. The width of the resulting gate electrode 121 shown in FIG. 3 depends on the distance between the dielectric spacers 133A.

Figure 5E:
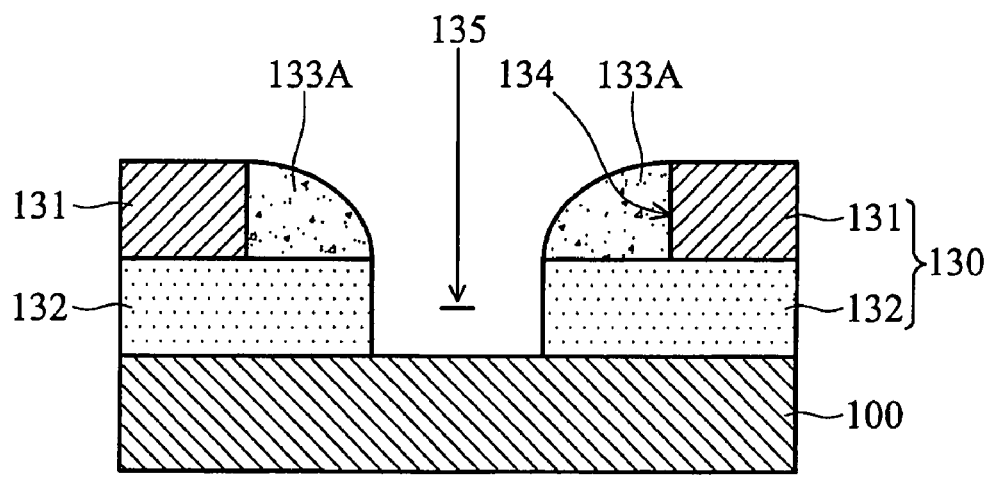

In FIG. 5E, the exposed dielectric layer 132 is removed by etching, for example, utilizing the dielectric spacers 133A and the dielectric layer 131 as a mask. The etching substantially stops on the substrate 100, forming a preliminary opening 135 in the dielectric layer 132, exposing parts of the substrate 100.

Figure 5F:
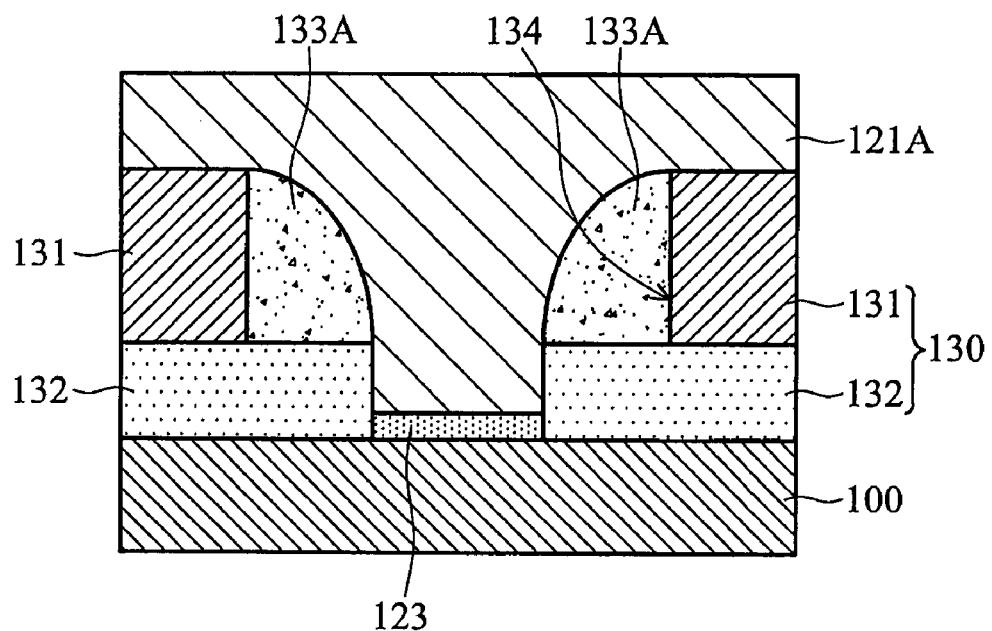
Figure 5G:
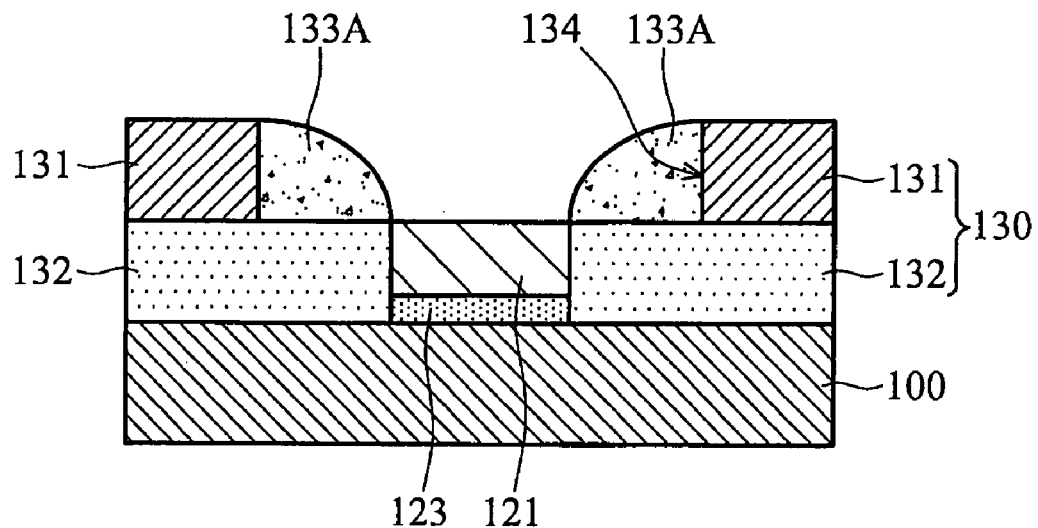
Figure 5H:
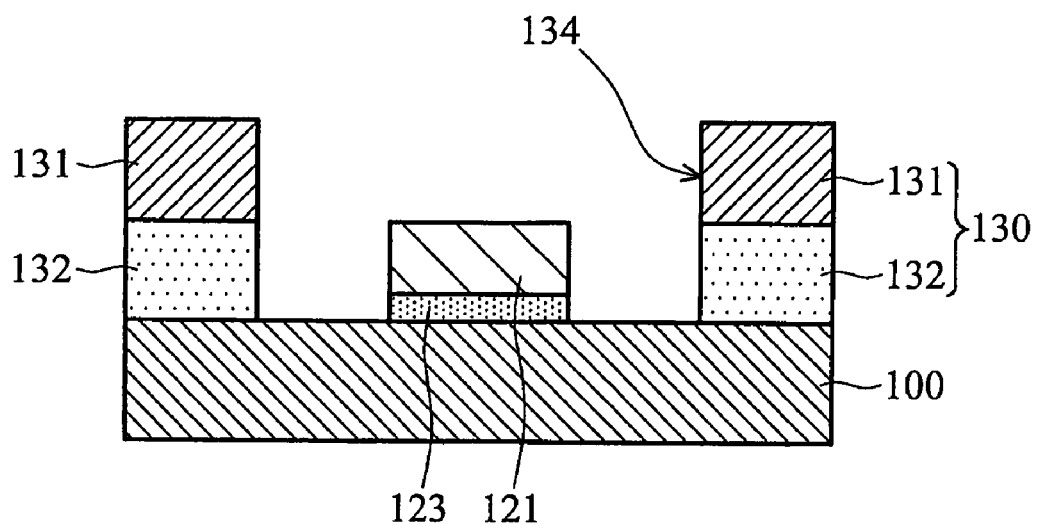

Next, the gate dielectric layer 123 is formed overlying the exposed substrate 100, and the gate electrode 121 is formed overlying the gate dielectric layer 123 as shown in FIG. 5G. Note that the steps shown in FIGS. 5F and 5G are exemplary, and not intended to limit the scope of the invention. Those skilled in the art will recognize the possibility of using various methods to achieve the formation of the gate dielectric layer 123 and the gate electrode 121 shown in FIG. 5G.

In FIG. 5F, the gate dielectric layer 123 is formed overlying the exposed substrate 100. In this embodiment, the gate dielectric layer 123 is formed by oxidation of the exposed substrate 100. In an alternative embodiment, the gate dielectric layer 123 can be formed by other selective methods to be disposed overlying the exposed substrate 100. In an alternative embodiment, the gate dielectric layer 123 can be conformally formed overlying the exposed substrate 100, the dielectric layers 131, 132, and the dielectric spacer 133A, and the dielectric layer 123 overlying the dielectric layers 131, 132 and the dielectric spacer 133A can be removed with the subsequent steps.

A blanket conductive layer 121A is then formed overlying the dielectric layer 131, covering the preliminary openings 134 and 135. Subsequently, the blanket conductive layer 121A beyond the preliminary opening 135 is removed by a method such as etching. In some cases, the etching may substantially stop on the dielectric layers 131, 132 and the dielectric spacer 133A, forming the gate electrode 121. In some cases, the potential remaining layer such as the gate dielectric layer 123 overlying the dielectric layer 132 and the dielectric spacer 133A as described can be simultaneously removed.

In FIG. 5G, the dielectric spacer 133A and the underlying dielectric layer 132 are removed by a method such as etching utilizing the dielectric layer 131 as an etch mask. Thus, the gate opening 136 shown in FIG. 4A is complete. The resulting first and second dielectric layers 131 and 132 act as the mask layer 130, and the process continues as described for FIGS. 4A through 4C.

As described, only one lithography mask is utilized in the step shown in FIG. 5B, and thus, the channel length of the channel region 103 shown in FIG. 3 can be well controlled and minimized, reducing the production cost and increasing integrity of the inventive memory device.

The efficacy of the memory device and a method of fabricating the same at reducing the channel length, and preventing bit unification due to reduction of the channel length, provides shorter channel length, separation of two bits, better programming efficiency, and higher device reliability.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
a first gate electrode overlying the substrate;
a second gate electrode overlying a top surface of the first gate electrode, the second gate electrode comprising end portions extending to spaces adjacent to the substrate and sidewalls of the first gate electrode; and
a dielectric layer comprising:
a first portion, sandwiched between the first gate electrode and the second gate electrode,
second portions extending from the first portion, sandwiched between the substrate and the end portions of the second gate electrode, and
third portions extending from the second portions and surrounding sidewalls of the end portions of the second gate electrode.

2. The device as claimed in claim 1, wherein the dielectric layer is a composite dielectric layer.

3. The device as claimed in claim 2, wherein the composite dielectric layer further comprises:
a tunneling layer;
a charge trapping layer overlying the tunneling layer; and
a blocking layer overlying the charge trapping layer.

4. The device as claimed in claim 2, wherein the composite dielectric layer further comprises a nitride layer sandwiched by at least two oxide layers.

5. The device as claimed in claim 1, wherein the first gate electrode comprises:
a gate dielectric layer overlying the substrate; and
a gate layer overlying the gate dielectric layer.

6. A flash EEPROM, comprising:
a substrate;
a first gate electrode overlying the substrate;
a second gate electrode overlying a top surface of the first gate electrode, the second gate electrode comprising a pair of end portions extending to spaces adjacent to the substrate and sidewalls of the first gate electrode; and
a dielectric layer comprising:
a first portion, sandwiched between the first gate electrode and the second gate electrode,
a pair of second portions extending from the first portion, sandwiched between the substrate and the pair of end portions of the second gate electrode, and
a pair of third portions extending from the pair of the second portions and surrounding sidewalls of the pair of the end portions.

7. The flash EEPROM as claimed in claim 6, wherein the dielectric layer is a composite dielectric layer.

8. The flash EEPROM as claimed in claim 7, wherein the composite dielectric layer further comprises:
a tunneling layer;
a charge trapping layer overlying the tunneling layer; and
a blocking layer overlying the charge trapping layer.

9. The flash EEPROM as claimed in claim 7, wherein the composite dielectric layer further comprises a nitride layer sandwiched by at least two oxide layers.

10. The flash EEPROM as claimed in claim 6, wherein the first gate electrode comprises:
a gate dielectric layer overlying the substrate; and
a gate layer overlying the gate dielectric layer.

11. A two-bit flash EEPROM, comprising:
a substrate;
an assistant gate electrode overlying the substrate;
a control gate electrode overlying a top surface of the assistant gate electrode, the control gate electrode comprising a pair of end portions extending to spaces adjacent to the substrate and sidewalls of the assistant gate electrode; and
a dielectric layer comprising:
a first portion, sandwiched between the assistant gate electrode and the control gate electrode,
a pair of second portions extending from the first portion, sandwiched between the substrate and the pair of end portions of the control gate electrode, thereby serving as two bits, and
a pair of third portions extending from the pair of the second portions and surrounding sidewalls of the pair of the end portions.

12. The two-bit flash EEPROM as claimed in claim 11, wherein the dielectric layer is a composite dielectric layer.

13. The two-bit flash EEPROM as claimed in claim 12, wherein the composite dielectric layer further comprises:
a tunneling layer;
a charge trapping layer overlying the tunneling layer; and
a blocking layer overlying the charge trapping layer.

14. The two-bit flash EEPROM as claimed in claim 12, wherein the composite dielectric layer further comprises a nitride layer sandwiched by at least two oxide layers.

15. The two-bit flash EEPROM as claimed in claim 11, wherein the assistant gate electrode comprises:
a gate dielectric layer overlying the substrate; and
a gate layer overlying the gate dielectric layer.

* * * * *